United States Patent
Tanaka

(10) Patent No.: US 12,189,007 B2
(45) Date of Patent: Jan. 7, 2025

(54) RADIO FREQUENCY COIL APPARATUS AND METHOD FOR CONTROLLING RADIO FREQUENCY COIL APPARATUS

(71) Applicant: CANON MEDICAL SYSTEMS CORPORATION, Tochigi (JP)

(72) Inventor: Yu Tanaka, Ota-ku (JP)

(73) Assignee: CANON MEDICAL SYSTEMS CORPORATION, Tochigi (JP)

(*) Notice: Subject to any disclaimer, the term of this patent is extended or adjusted under 35 U.S.C. 154(b) by 130 days.

(21) Appl. No.: 18/180,903

(22) Filed: Mar. 9, 2023

(65) Prior Publication Data

US 2023/0296706 A1 Sep. 21, 2023

(30) Foreign Application Priority Data

Mar. 15, 2022 (JP) ................. 2022-040513

(51) Int. Cl.
| | | |
|---|---|---|
| G01R 33/3415 | (2006.01) | |
| G01R 33/00 | (2006.01) | |
| G01R 33/34 | (2006.01) | |
| G01R 33/56 | (2006.01) | |

(52) U.S. Cl.
CPC ..... *G01R 33/3415* (2013.01); *G01R 33/0029* (2013.01); *G01R 33/34046* (2013.01); *G01R 33/5608* (2013.01)

(58) Field of Classification Search
CPC .......... G01R 33/0029; G01R 33/34046; G01R 33/3415; G01R 33/5608
See application file for complete search history.

(56) References Cited

U.S. PATENT DOCUMENTS

| | | | | |
|---|---|---|---|---|
| 9,525,384 | B2* | 12/2016 | Lee ................. | H03F 3/245 |
| 9,859,847 | B2* | 1/2018 | Paek ............... | H03F 3/3064 |
| 11,864,862 | B2* | 1/2024 | Moor .............. | G01R 33/36 |
| 2017/0147020 | A1* | 5/2017 | Turkewadikar ..... | G05F 1/56 |

FOREIGN PATENT DOCUMENTS

JP 2009-302710 A 12/2009

* cited by examiner

*Primary Examiner* — Gregory H Curran
(74) *Attorney, Agent, or Firm* — Oblon, McClelland, Maier & Neustadt, L.L.P.

(57) ABSTRACT

A radio frequency coil apparatus according to an embodiment is a radio frequency coil apparatus to be disposed in a bore of a magnetic resonance imaging apparatus and including processing circuitry. The processing circuitry acquires a nuclear magnetic resonance signal generated from a subject placed in the bore. The processing circuitry supplies voltage to a constituent component of the radio frequency coil apparatus by using a switching regulator and a linear regulator. The processing circuitry selectively drives the switching regulator and the linear regulator based on an imaging sequence of the magnetic resonance imaging apparatus. The processing circuitry drives the linear regulator in a first duration including a duration in which the nuclear magnetic resonance signal is acquired, and drives the switching regulator in a second duration other than the first duration.

12 Claims, 8 Drawing Sheets

US 12,189,007 B2

RADIO FREQUENCY COIL APPARATUS AND METHOD FOR CONTROLLING RADIO FREQUENCY COIL APPARATUS

CROSS-REFERENCE TO RELATED APPLICATIONS

This application is based upon and claims the benefit of priority from Japanese Patent Application No. 2022-040513, filed on Mar. 15, 2022; the entire contents of which are incorporated herein by reference.

FIELD

Embodiments described herein relate generally to a radio frequency coil apparatus and a method for controlling a radio frequency coil apparatus.

BACKGROUND

Conventionally, measurement technologies for quantifying and visualizing an invisible physical phenomenon have been developed in various fields. For example, in the field of magnetic resonance imaging (MRI), a faint nuclear magnetic resonance (NMR) signal of a subject in a magnetic field (imaging region) of an MRI apparatus is detected by a radio frequency (RF) coil apparatus and image data is acquired through energy conversion. Typically, most electric signals obtained by a sensing element are digitized by an analog-digital converter (hereinafter referred to as an A/D converter). With the digitization, it is possible to achieve processing such as storage, transmission, and conversion at high speed without worrying about data degradation.

DETAILED DESCRIPTION

An RF coil apparatus according to an embodiment is an RF coil apparatus to be disposed in a bore of an MRI apparatus and including an acquisition unit, a supply unit, and a control unit. The acquisition unit acquires an NMR signal generated from a subject placed in the bore. The supply unit supplies voltage to any constituent component of the RF coil apparatus by using a switching regulator and a linear regulator. The control unit selectively drives the switching regulator and the linear regulator based on an imaging sequence of the MRI apparatus. The control unit drives the linear regulator in a first duration including a duration in which the NMR signal is acquired, and drives the switching regulator in a second duration other than the first duration.

The following describes embodiments of an RF coil apparatus and a method for controlling an RF coil apparatus according to the present application in detail with reference to the accompanying drawings. The embodiments described below are examples as means for achieving any technology disclosed in the present application and are modified or changed as appropriate depending on the configuration of an apparatus to which the technology is applied and various conditions. In other words, the technology disclosed in the present application is not necessarily limited to the embodiments below. Not all combinations of features described below in the embodiments are necessarily essential to technical solution disclosed in the present application.

The following first describes the operation principle of an MRI system according to a comparative example of a first embodiment before describing the embodiments according to the present application.

Figure 1:
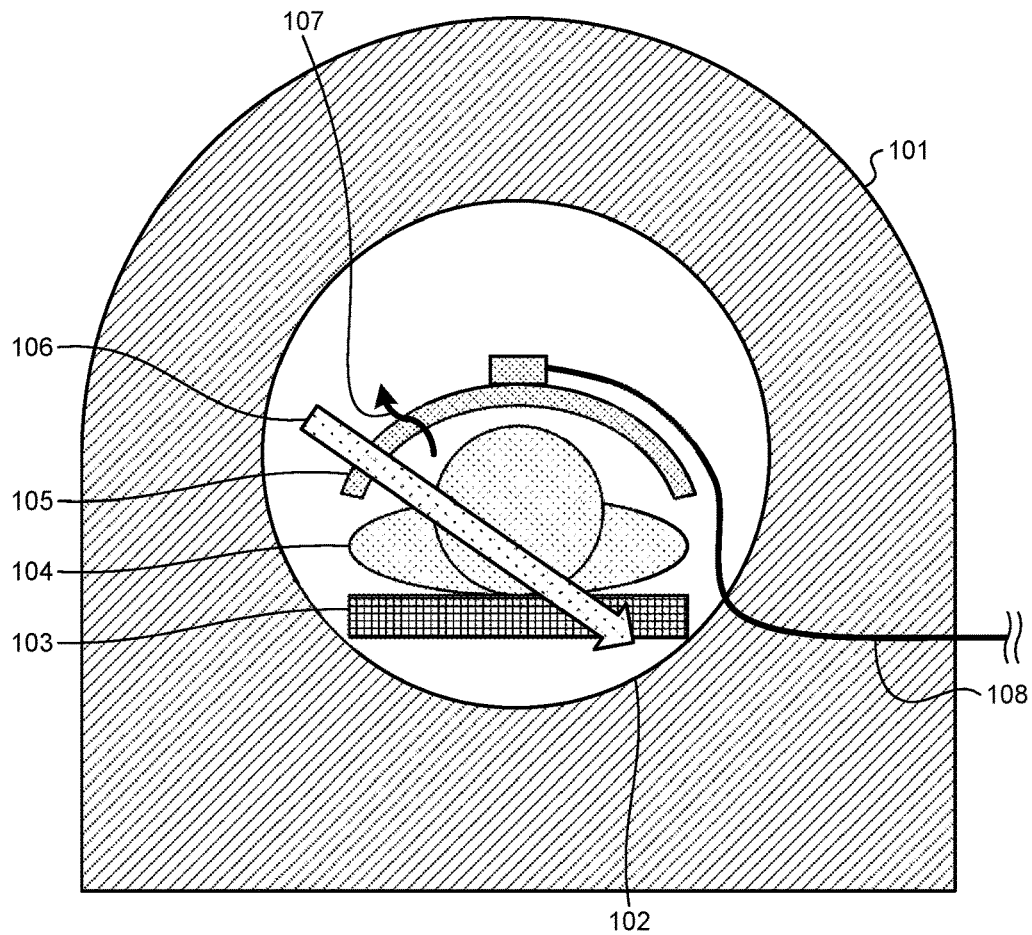
FIG. 1 is a sectional view illustrating the operation principle of an MRI system according to a comparative example of a first embodiment.

Configuration of MRI System According to Comparative Example of First Embodiment FIG. 1 is a sectional view illustrating the operation principle of the MRI system according to the comparative example of the first embodiment.

For example, as illustrated in FIG. 1, the MRI system includes an MRI apparatus 101 and an RF coil apparatus 105.

The MRI apparatus 101 includes a bore 102 that is a space part bored in a cylindrical shape, and a non-magnetic bed 103 is placed in the bore 102 in parallel with the installation surface of the MRI apparatus 101. The RF coil apparatus 105 is wound around a measurement place of a subject 104 as a patient being placed at rest on the bed 103. In this manner, the RF coil apparatus 105 is disposed in the bore 102 of the MRI apparatus 101.

In this state, the MRI apparatus 101 transmits a static magnetic field (not illustrated), a gradient magnetic field (not illustrated), and a radio frequency magnetic field 106 that rotates in a plane orthogonal to a depth direction of the bore 102. Then, the RF coil apparatus 105 measures a faint NMR signal 107 generated from the subject 104 by the radio frequency magnetic field 106. The RF coil apparatus 105 transmits measurement data obtained by digitizing the measured NMR signal 107 to the MRI apparatus 101 (or an image processing apparatus (not illustrated)) through a transmission line 108. Thereafter, the transmitted measurement data is converted to an image in the MRI apparatus 101 (or the image processing apparatus (not illustrated)).

Figure 2:
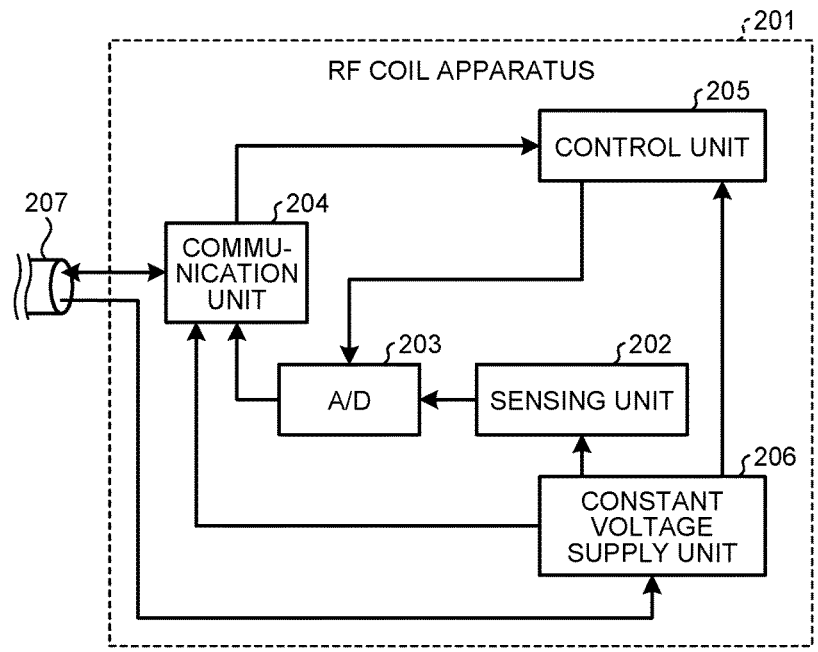
FIG. 2 is a diagram illustrating an exemplary configuration of an RF coil apparatus in the MRI system according to the comparative example of the first embodiment.

FIG. 2 is a diagram illustrating an exemplary configuration of an RF coil apparatus in the MRI system according to the comparative example of the first embodiment.

For example, as illustrated in FIG. 2, an RF coil apparatus 201 includes a sensing unit 202, an A/D converter 203, a communication unit 204, a control unit 205, and a constant voltage supply unit 206 and is connected to the MRI apparatus 101 (or the image processing apparatus (not illustrated)) through a transmission line 207.

The sensing unit 202 acquires the NMR signal 107 generated from the subject 104 placed in the bore 102. Specifically, the sensing unit 202 includes a plurality of coils connected in parallel and acquires the NMR signal 107 by measuring, as an analog electric signal, change in a value of a current excited when the NMR signal 107 generated from the subject 104 penetrates through the loop of each coil. The A/D converter 203 acquires measurement data by converting the analog electric signal measured by the sensing unit 202 into a digital signal. The measurement data is transmitted as a measurement result to the MRI apparatus 101 (or the image processing apparatus (not illustrated)) by the communication unit 204.

The control unit 205 controls, by using a control signal, a drive timing of the A/D converter 203 based on an imaging sequence received from the MRI apparatus 101 (or the image processing apparatus (not illustrated)) through the transmission line 207 and the communication unit 204, the imaging sequence defining execution of scanning including application of the gradient magnetic field, transmission of the radio frequency magnetic field 106, and acquisition of the NMR signal 107 that are performed by the MRI apparatus 101. The MRI apparatus 101 (or the image processing apparatus (not illustrated)) can set, manage, and select a plurality of patterns of the imaging sequence.

The constant voltage supply unit 206 has a function to supply, as constant voltage to each constituent component, power supplied from the MRI apparatus 101 through the transmission line 207.

The transmission line 207 may transmit, for example, a clock signal (not illustrated) supplied from the MRI apparatus 101 (or the image processing apparatus (not illustrated)) and used by the RF coil apparatus 201 in addition to the measurement data, the imaging sequence, and the power described above.

In such a configuration, for example, the constant voltage supply unit 206 includes a DC/DC converter (hereinafter referred to as a DCDC), which is a switching regulator, and a low dropout regulator (hereinafter referred to as an LDO), which is a linear regulator.

Among these components, the DCDC has low electric power consumption (in other words, high voltage conversion efficiency) but has large ripples and harmonic noise. The LDO has high electric power consumption (in other words, low voltage conversion efficiency) but has small ripples and harmonic noise.

In the RF coil apparatus 201 described above, noise mixture before the analog electric signal obtained by the sensing unit 202 is converted into a digital signal by the A/D converter 203 needs to be avoided as much as possible to obtain the measurement data as a measurement result without disorder. However, when the constant voltage supply unit 206 uses the DCDC, harmonic noise generated from the DCDC is superimposed on the analog electric signal, which may lead to degradation of the signal-to-noise ratio (S/N) of the measurement data. When the constant voltage supply unit 206 uses the LDO, such harmonic noise is not generated and thus the measurement data is not affected.

Furthermore, the RF coil apparatus 201, which detects the NMR signal 107, desirably obtains a highly accurate measurement result without degradation of electric power efficiency. High voltage conversion efficiency can be obtained when the constant voltage supply unit 206 uses the DCDC, but the above-described influence of the harmonic noise generated from the DCDC on the measurement data can be a problem. Noise mixture in the analog electric signal obtained by the RF coil apparatus 201 directly leads to S/N degradation of image data due to disorder of a digital signal obtained as a measurement result and thus needs to be avoided as much as possible.

For this reason, the embodiments described below are configured so that a highly accurate measurement result can be obtained without degradation of electric power efficiency of an RF coil apparatus.

First Embodiment

The following first describes the first embodiment. The present embodiment is described with an example in which wireless communication between an RF coil apparatus and an MRI apparatus is performed.

Recently, in the field of MRI as well as the other technical fields, expectation has been high on schemes of transmitting digitized data/signals by wireless communication. Changing a wired connection to a wireless connection provides such advantage that the freedom of disposition increases for an RF coil apparatus disposed in proximity to a patient and thermal injury caused on the patient by wires is prevented. Changing to a wireless connection also affects a power source part, and the RF coil apparatus needs to include a battery for driving the internal components.

In such an RF coil apparatus using wireless communication, voltage supplied from the battery is typically higher than voltage that drives any component used in wireless communication, and thus a voltage regulator for stabilizing voltage is used. Examples of the voltage regulator include the LDO, which is a linear regulator, and the DCDC, which is a switching regulator, as described above.

As described above, the RF coil apparatus using wireless communication is driven by voltage supplied from the battery, and thus it is more important to obtain a measurement result without degradation of electric power efficiency than in a case in which a large amount of power is supplied from an MRI apparatus.

Configuration of MRI System According to First Embodiment

Figure 3:
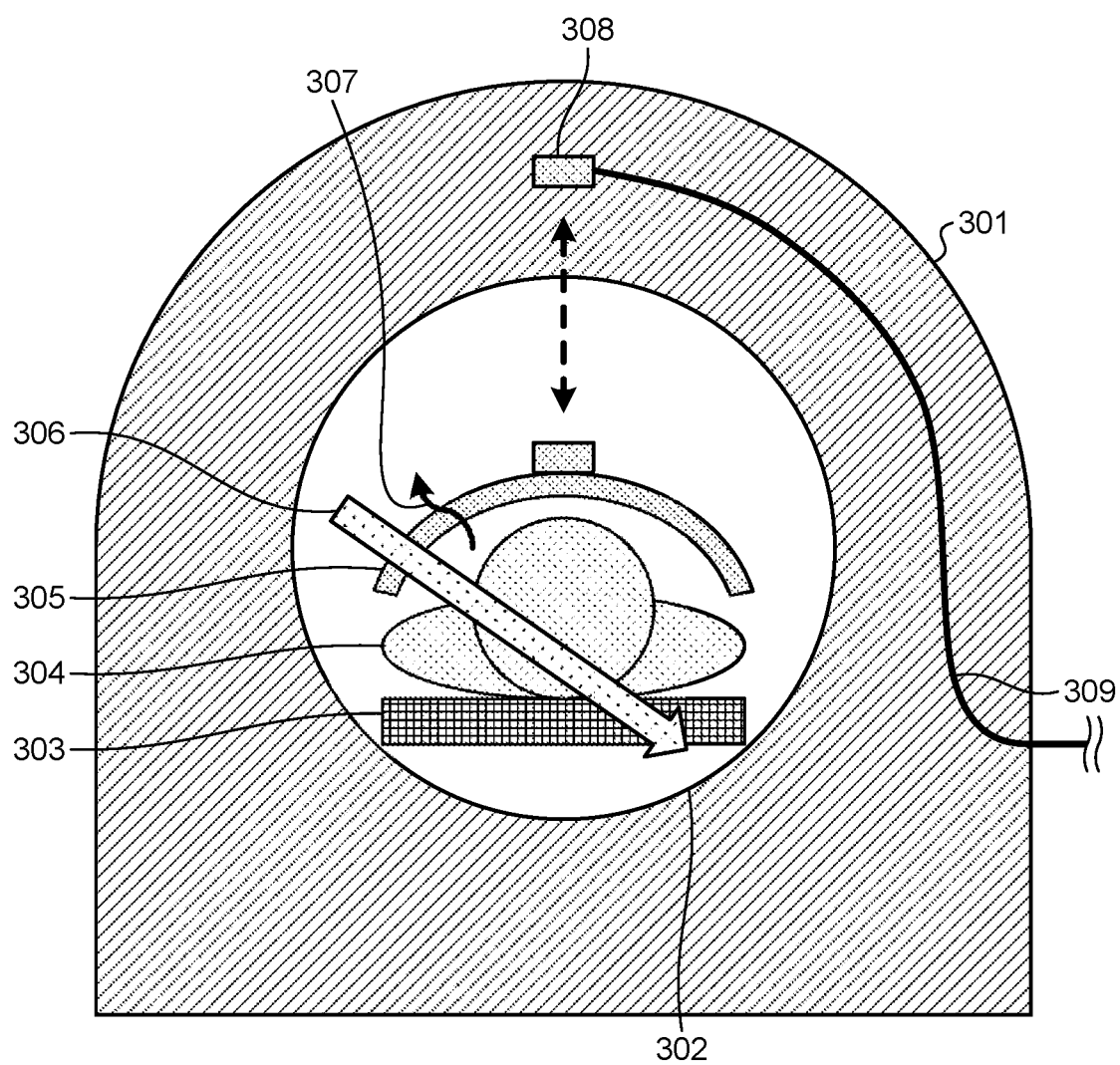
FIG. 3 is a sectional view illustrating the operation principle of an MRI system according to the first embodiment.

FIG. 3 is a sectional view illustrating the operation principle of the MRI system according to the first embodiment.

For example, as illustrated in FIG. 3, the MRI system according to the present embodiment includes an MRI apparatus 301 and an RF coil apparatus 305.

The MRI apparatus 301 includes a bore 302 and a wireless communication unit 308, and a non-magnetic bed 303 is placed in the bore 302 in parallel with the installation surface of the MRI apparatus 301. The RF coil apparatus 305 is wound around a measurement place of a subject 304 being placed at rest on the bed 303. In this manner, the RF coil apparatus 305 is disposed in the bore 302 of the MRI apparatus 301.

In this state, the MRI apparatus 301 transmits a static magnetic field (not illustrated), a gradient magnetic field (not illustrated), and a radio frequency magnetic field 306. Then, the RF coil apparatus 305 measures a faint NMR signal 307 generated from the subject 304 by the radio frequency magnetic field 306. The RF coil apparatus 305 is wirelessly connected to the wireless communication unit 308 of the MRI apparatus 301 and transmits measurement data obtained by digitizing the measured NMR signal 307 to the MRI apparatus 301 (or an image processing apparatus (not illustrated)) through a transmission line 309. Then, the transmitted measurement data is converted to an image in the MRI apparatus 301 (or the image processing apparatus (not illustrated)).

The wireless communication unit 308 is fixed to, for example, the exterior of the MRI apparatus 301 and performs over-the-horizon communication with the RF coil apparatus 305 in the bore 302. In this case, the wireless communication unit 308 performs wireless communication by using a frequency higher than the frequency of the NMR signal 307. For example, the wireless communication unit 308 performs the wireless communication by using a 2.4 GHz band wireless local area network (LAN) with which wraparound of electromagnetic waves is expected. The frequency band of the wireless communication used by the wireless communication unit 308 only needs not to overlap the frequency band of several tens to several hundreds MHz, which is used by the radio frequency magnetic field 306, and wireless communication using a higher frequency, for example, a 5 GHz band wireless LAN may be used. The method of the wireless communication by the wireless communication unit 308 is not limited to communication through a wireless LAN but may be wireless communication using an industrial scientific and medical (ISM) band or may be wireless communication using submillimeter waves, millimeter waves, or visible light. However, the capability of straight propagation of electromagnetic waves increases when a high frequency is used, and thus the wireless communication unit 308 is desirably disposed separately from the MRI apparatus 301 such that the wireless communication unit 308 can perform line-of-sight communication with the RF coil apparatus 305.

Figure 4:
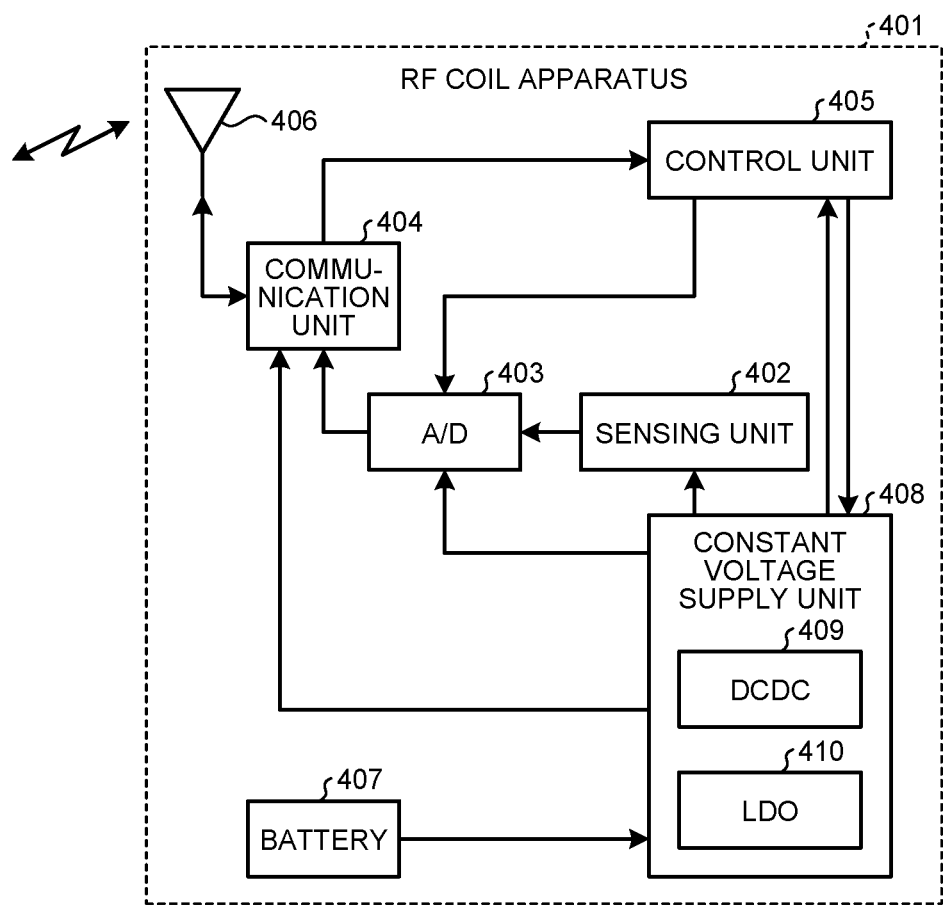
FIG. 4 is a diagram illustrating an exemplary configuration of an RF coil apparatus in the MRI system according to the first embodiment.

FIG. 4 is a diagram illustrating an exemplary configuration of an RF coil apparatus in the MRI system according to the first embodiment.

For example, as illustrated in FIG. 4, an RF coil apparatus 401 includes a sensing unit 402, an A/D converter 403, a communication unit 404, a control unit 405, an antenna 406, a battery 407, and a constant voltage supply unit 408.

The sensing unit 402 and the A/D converter 403 have the same functions as the sensing unit 202 and the A/D converter 203, respectively, in the RF coil apparatus 201 illustrated in FIG. 2. Specifically, the sensing unit 402 acquires the NMR signal 307 by measuring, as an analog electric signal, the NMR signal 307 generated from the subject 304 placed in the bore 302. The A/D converter 403 acquires measurement data by converting the analog electric signal measured by the sensing unit 402 into a digital signal. The measurement data is transmitted as a measurement result to the MRI apparatus 301 (or the image processing apparatus (not illustrated)) through the antenna 406 and the wireless communication unit 308 of the MRI apparatus 301 by the communication unit 404.

The control unit 405 controls a drive timing of the A/D converter 403 by using a control signal based on an imaging sequence received from the MRI apparatus 301 (or the image processing apparatus (not illustrated)) through the wireless communication unit 308 of the MRI apparatus 301, the antenna 406, and the communication unit 404, the imaging sequence defining execution of scanning includes application of the gradient magnetic field, transmission of the radio frequency magnetic field 306, and acquisition of the NMR signal 307 that are performed by the MRI apparatus 301. The drive timing of the A/D converter 403 is actively controlled in accordance with the sensing unit 402, which passively functions. Thus, an acquisition duration taken for acquisition of the NMR signal 307 is substantially equal to a drive duration of the A/D converter 403.

The constant voltage supply unit 408 includes a DCDC 409 and an LDO 410 and supplies voltage to any constituent component of the RF coil apparatus 401. Specifically, the constant voltage supply unit 408 functions as a voltage conversion unit configured to convert voltage from the battery 407 and supply the converted voltage as constant voltage to each constituent component of the RF coil apparatus 401, and the DCDC 409 and the LDO 410 are configured in a switchable manner (for example, in parallel connection).

The communication unit 404 transmits and receives a clock signal (not illustrated) used by the RF coil apparatus 401 in addition to the measurement data and the imaging sequence described above by performing wireless communication with the wireless communication unit 308 of the MRI apparatus 301 through the antenna 406. In this case, the communication unit 404 performs the wireless communication by using a frequency higher than the frequency of the NMR signal 307. The communications may be performed by using different antennas and frequency bands to avoid S/N degradation due to mutual interference among the measurement data, the imaging sequence, and the clock signal.

For example, the sensing unit 402, the communication unit 404, the control unit 405, the constant voltage supply unit 408, and the wireless communication unit 308 described above are each implemented by processing circuitry having the described-above processing function. In this case, the processing circuitry means circuitry such as an application specific integrated circuit (ASIC) or a programmable logic device (for example, a simple programmable logic device (SPLD), a complex programmable logic device (CPLD), or a field programmable gate array (FPGA)). For example, when the processing circuitry is an ASIC, the processing function is directly incorporated as a logic circuitry in the processing circuitry. The processing circuitry is not limited to a configuration in which the processing circuitry is configured as a single circuitry for each processing function, but may be configured as one processing circuitry by combining a plurality of independent pieces of circuitry to implement the processing function. Moreover, a plurality of constituent components in FIG. 4 may be integrated in one processing circuitry to implement the processing function.

The sensing unit 402 in the present embodiment is an exemplary acquisition unit. The communication unit 404 in the present embodiment is an exemplary second communication unit. The control unit 405 in the present embodiment is an exemplary control unit. The constant voltage supply unit 408 in the present embodiment is an exemplary supply unit. The wireless communication unit 308 in the present embodiment is an exemplary first communication unit.

With such a configuration, in the present embodiment, the control unit 405 selectively drives the DCDC 409 and the LDO 410 based on the imaging sequence of the MRI apparatus 301.

Specifically, the control unit 405 drives the LDO 410, which has small harmonic noise, and stops the DCDC 409 in the acquisition duration in which the NMR signal 307 is acquired by the sensing unit 402 and the A/D converter 403. The control unit 405 drives the DCDC 409, which has high voltage conversion efficiency, and stops the LDO 410 in the duration other than the acquisition duration.

Accordingly, it is possible to perform electric power drive with taking into account finite power source capacity of the battery 407 at a viewpoint of electric power consumption.

Timing of Switching Between DCDC and LDO According to First Embodiment

Figure 5:
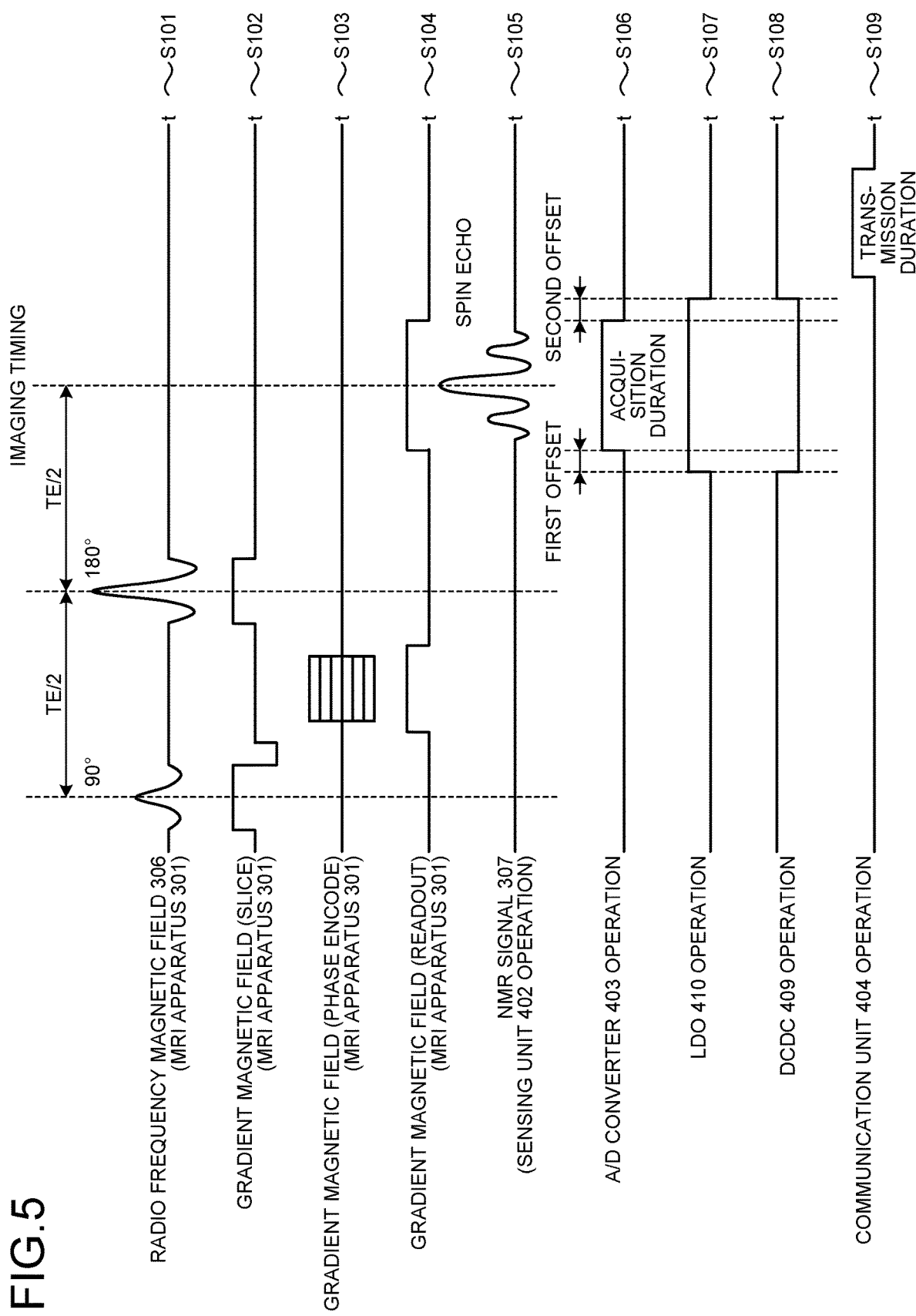
FIG. 5 is a diagram illustrating a timing chart of the MRI system according to the first embodiment.

FIG. 5 is a diagram illustrating a timing chart of the MRI system according to the first embodiment.

Specifically, FIG. 5 illustrates a timing chart of operation of the MRI apparatus 301, the sensing unit 402, the A/D converter 403, the LDO 410, the DCDC 409, and the communication unit 404 in the present embodiment together with a pulse sequence in an MRI spin echo method. Detailed description of the operation principle of MRI and image acquisition is omitted.

For example, as illustrated in FIG. 5, the MRI apparatus 301 emits a radio frequency magnetic field (90° pulse) and emits a radio frequency magnetic field (180° pulse) again after a constant duration (TE/2). In addition, the MRI apparatus 301 uses a gradient magnetic field (slice), a gradient magnetic field (phase encode), and a gradient magnetic field (readout), thereby acquiring spin echo, which is the NMR signal 307, after a constant duration (TE/2) following the radio frequency magnetic field (180° pulse).

Then, the control unit 405 of the RF coil apparatus 401 sets an acquisition duration taken for acquisition of the spin echo based on a transmission timing of the radio frequency magnetic field 306 or an acquisition timing of the NMR signal 307 that are defined by the imaging sequence of the MRI apparatus 301.

For example, the control unit 405 extracts TE/2 (or TE) from the imaging sequence that defines the transmission timing of the radio frequency magnetic field 306, and calculates an imaging timing at which the spin echo can be measured. Then, the control unit 405 performs switching control of the DCDC 409 and the LDO 410 based on the calculated imaging timing in accordance with the drive duration of the A/D converter 403 as the acquisition duration of the spin echo. The imaging timing or the acquisition duration may be included in the imaging sequence. In this case, the control unit 405 performs the switching control based on the imaging timing or the acquisition duration included in the imaging sequence.

Specifically, in the duration in which the A/D converter 403 is not driven, no digital signal is generated and an analog electric signal is discarded, and thus the duration in which the DCDC 409 is stopped can be limited to the acquisition duration. Specifically, the control unit 405 drives the LDO 410, which has small harmonic noise, and stops the DCDC 409 in the acquisition duration in which the NMR signal 307 is acquired. The control unit 405 drives the DCDC 409, which has high voltage conversion efficiency, and stops the LDO 410 in the other duration than the acquisition duration. In this case, the acquisition duration is an exemplary first duration. The duration other than the acquisition duration is an exemplary second duration.

To avoid voltage variation at the switching from the DCDC 409 to the LDO 410, a constant earlier time offset (first offset) may be provided from the start timing of the acquisition duration. Similarly, to avoid voltage variation at the switching from the LDO 410 to the DCDC 409, a constant later time offset (second offset) may be provided from the end timing of the acquisition duration. These time offsets are included in, for example, the signal for control of the A/D converter 403 by the control unit 405.

In this manner, when the time offsets are used, the control unit 405 drives the LDO 410, which has small harmonic noise, and stops the DCDC 409 in the duration from the first offset to the second offset through the acquisition duration. The control unit 405 drives the DCDC 409 and stops the LDO 410 in the duration other than the duration from the first offset to the second offset through the acquisition duration.

Accordingly, it is possible to perform control with electric power efficiency taken into account while improving voltage stability.

The series of processes illustrated in the timing chart may be repeated a defined number of times in accordance with the imaging sequence. The present embodiment is not limited to the spin echo method but is applicable to all imaging methods (or imaging sequences) used for MRI.

Process of Processing by MRI System According to First Embodiment

Figure 6:
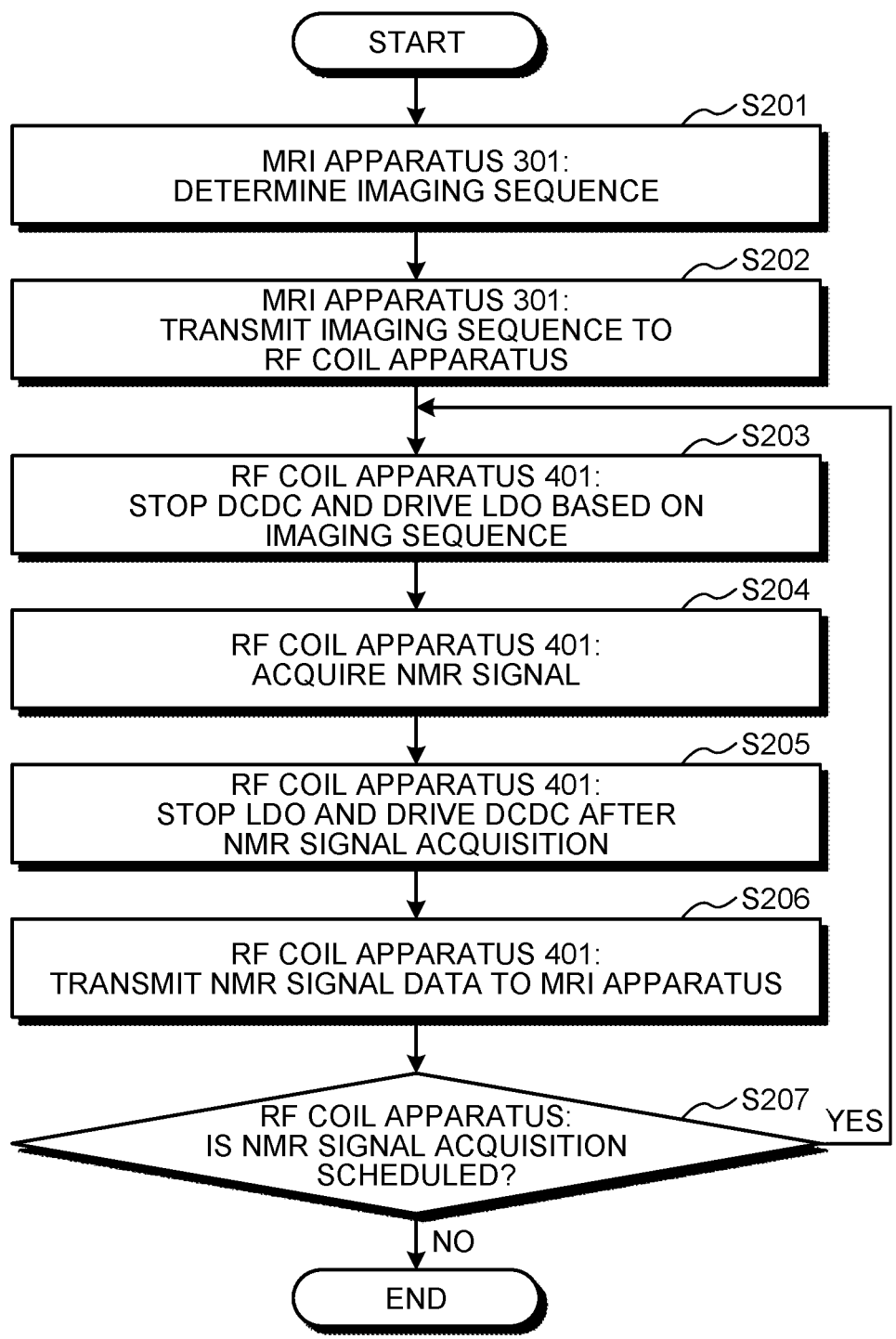
FIG. 6 is a flowchart of processing executed by the MRI system according to the first embodiment.

FIG. 6 is a flowchart of processing executed by the MRI system according to the first embodiment.

Specifically, FIG. 6 illustrates a flowchart of processing executed by the MRI apparatus 301 and the RF coil apparatus 401 in the present embodiment. In description of FIG. 6, it is assumed that the timing chart illustrated in FIG. 5 is referred and the time offsets (first and second offsets) are valid. It is assumed that the MRI apparatus 301 and the RF coil apparatus 401 are connected to each other through a wireless LAN, and description of the connection processing of the wireless LAN is omitted.

For example, as illustrated in FIG. 6, the MRI apparatus 301 first determines an imaging sequence (step S201) and transmits the determined imaging sequence to the RF coil apparatus 401 through the wireless communication unit 308 (step S202).

Subsequently, having received the imaging sequence, the control unit 405 of the RF coil apparatus 401 controls the constant voltage supply unit 408 based on the timing chart illustrated in FIG. 5 (step S203). Specifically, the control unit 405 stops the DCDC 409 and drives the LDO 410 at a time point earlier than the start of the acquisition duration by the first offset.

Subsequently, in the acquisition duration, the sensing unit 402 of the RF coil apparatus 401 acquires the NMR signal 307 and the A/D converter 403 acquires measurement data by converting the NMR signal 307 into a digital signal (step S204). In this case, since the LDO 410 is operational, no harmonic noise is generated and no noise mixture in the measurement data due to the constant voltage supply unit 408 occurs.

Subsequently, the control unit 405 of the RF coil apparatus 401 stops the LDO 410 and drives the DCDC 409 at a time point when the second offset has elapsed since the end of the acquisition duration (step S205).

Subsequently, the communication unit 404 of the RF coil apparatus 401 transmits, to the MRI apparatus 301 by wireless communication through the antenna 406, the measurement data output from the A/D converter 403 (step S206).

Thereafter, the control unit 405 of the RF coil apparatus 401 determines whether acquisition of the NMR signal 307 is scheduled based on the imaging sequence, and when the acquisition is scheduled (Yes at step S207), the control unit 405 repeats the above-described processing at steps S203 to S206 a defined number of times. When the acquisition is not scheduled (No at step S207), the control unit 405 ends the above-described series of processing.

In this manner, the MRI system according to the first embodiment drives the LDO 410 and stops the DCDC 409 based on the imaging sequence in the duration in which the measurement data is acquired. Accordingly, it is possible to prevent mixture of harmonic noise due to the DCDC 409 in the duration in which the NMR signal 307 obtained by the sensing unit 402 is acquired by the A/D converter 403 while preventing degradation of electric power efficiency, and obtain a highly accurate measurement result.

In any above-described processing, the control unit 405 may stop the LDO 410 and drive the DCDC 409 irrespective of the imaging sequence when the RF coil apparatus 401 is disposed at a position outside the bore 302 of the MRI apparatus 301 in a case of measurement interruption, emergency, or the like. As described for the configuration of the MRI system, since the faint NMR signal 307 of the subject 304 cannot be measured unless the RF coil apparatus 401 is disposed in the bore 302, power saving may be prioritized.

Second Embodiment

The following describes a second embodiment. The present embodiment is described with an example in which part of the first embodiment is changed and the constant voltage supply unit is controlled with taking into account wireless communication in addition to the acquisition duration. The following description is made on any difference from the first embodiment and omits description of the same matter as in the first embodiment, such as the configuration of an MRI system.

Timing of Switching Between DCDC and LDO According to Second Embodiment

Figure 7:
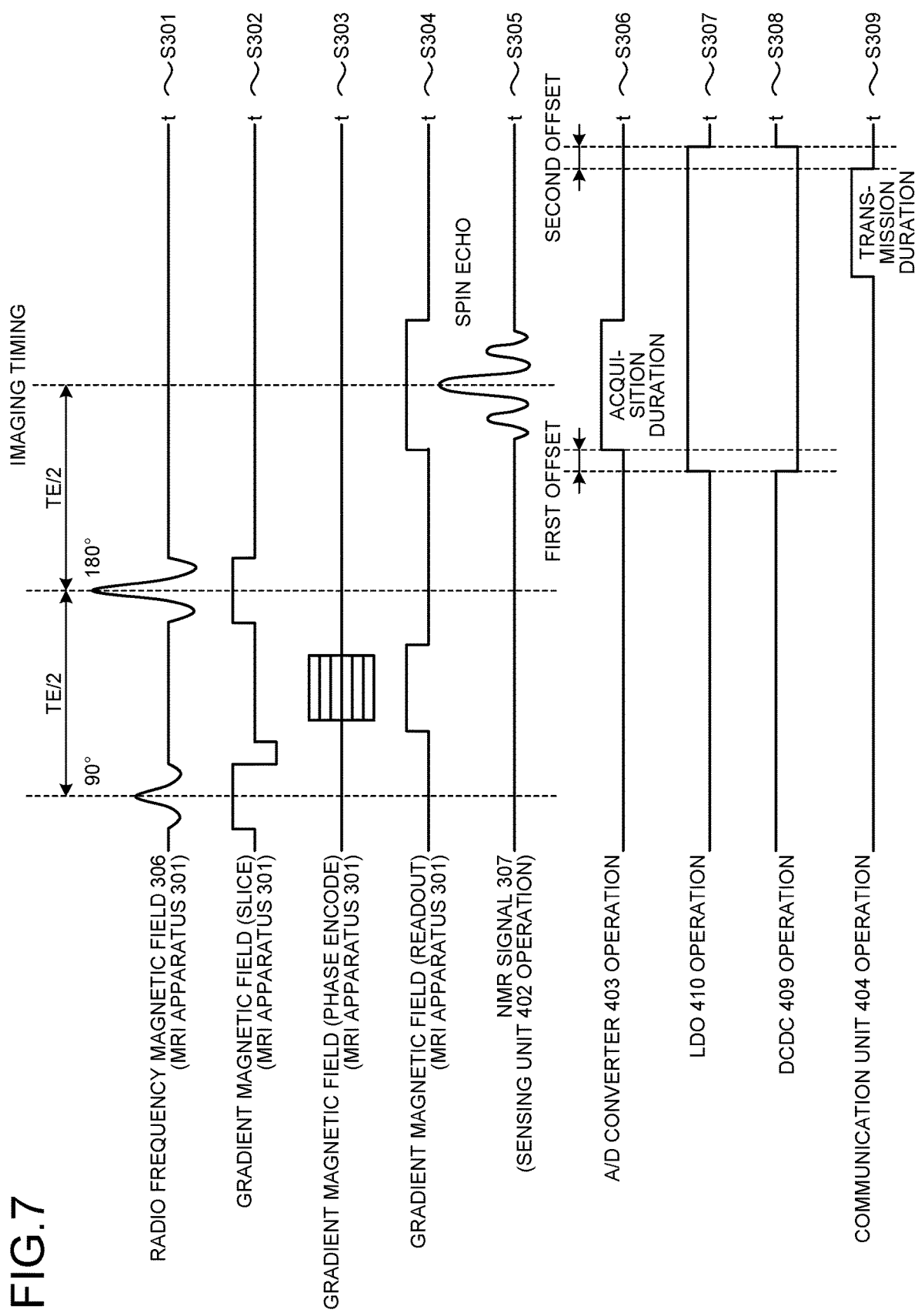
FIG. 7 is a diagram illustrating a timing chart of an MRI system according to a second embodiment.

FIG. 7 is a diagram illustrating a timing chart of an MRI system according to the second embodiment.

Specifically, FIG. 7 illustrates a timing chart of operation of the MRI apparatus 301, the sensing unit 402, the A/D converter 403, the LDO 410, the DCDC 409, and the communication unit 404 in the present embodiment together with a pulse sequence in the MRI spin echo method. Detailed description of the operation principle of MRI and image acquisition is omitted.

For example, when the communication unit 404 uses a 2.4 GHz band wireless LAN and a 5 GHz band wireless LAN, harmonic noise due to the DCDC 409 may cause third-order intermodulation distortion to the 5 GHz band and degrade the S/N of wireless communication.

Thus, in the present embodiment, the control unit 405 performs switching control of the DCDC 409 and the LDO 410 in accordance with the drive duration of the A/D converter 403 as the acquisition duration of the spin echo and a transmission duration as the duration in which measurement data is transmitted to the MRI apparatus 301 by the communication unit 404.

Specifically, the DCDC 409 is stopped in the duration after the acquisition duration of the spin echo and before the transmission duration of measurement data. Specifically, the control unit 405 drives the LDO 410, which has small harmonic noise, and stops the DCDC 409 in the transmission duration in addition to the acquisition duration. The control unit 405 drives the DCDC 409, which has high voltage conversion efficiency, and stops the LDO 410 the duration other than the acquisition duration and the transmission duration. In this case, the acquisition duration is an exemplary first duration. The transmission duration is an exemplary third duration. The duration other than the acquisition duration and the transmission duration is an exemplary fourth duration.

To avoid voltage variation at the switching from the DCDC 409 to the LDO 410, a constant earlier time offset (first offset) may be provided from the start timing of the acquisition duration. Similarly, to avoid voltage variation at the switching from the LDO 410 to the DCDC 409, a constant later time offset (second offset) may be provided from the end timing of the transmission duration. These time offsets are included in, for example, the signal for control of the A/D converter 403 by the control unit 405. The transmission duration is set, for example, by notifying the control unit 405 of the remaining time of measurement data transmission or transmission end from the communication unit 404.

In this manner, when the time offsets are used, the control unit 405 drives the LDO 410, which has small harmonic noise, and stops the DCDC 409 in the duration from the first offset to the second offset through the acquisition duration and the transmission duration. The control unit 405 drives the DCDC 409 and stops the LDO 410 in the duration other than the duration from the first offset to the second offset through the acquisition duration and the transmission duration.

Accordingly, it is possible to perform control with electric power efficiency taken into account while improving voltage stability.

The control unit 405 may switch from the LDO 410 to the DCDC 409 once when having determined that the interval between the acquisition duration and the transmission duration is sufficiently large.

Process of Processing by MRI System According to Second Embodiment

Figure 8:
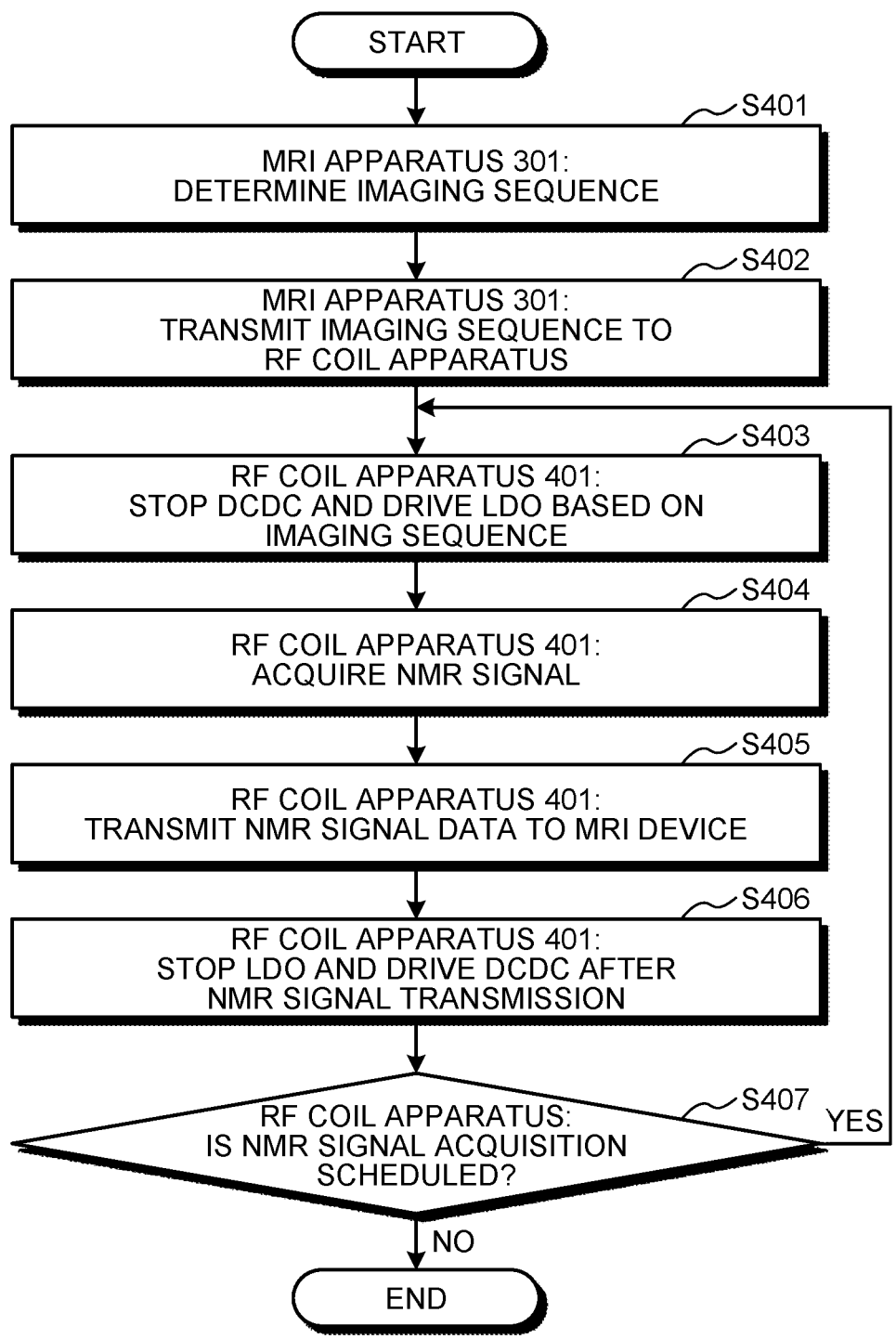
FIG. 8 is a flowchart of processing executed by the MRI system according to the second embodiment.

FIG. 8 is a flowchart of processing executed by the MRI system according to the second embodiment.

Specifically, FIG. 8 illustrates an exemplary flowchart of processing executed by the MRI apparatus 301 and the RF coil apparatus 401 in the present embodiment. In description of FIG. 8, it is assumed that the timing chart illustrated in FIG. 7 is referred and the time offsets (first and second offsets) are valid. It is assumed that the MRI apparatus 301 and the RF coil apparatus 401 are connected to each other through a wireless LAN, and description of the connection processing of the wireless LAN is omitted.

For example, as illustrated in FIG. 8, the MRI apparatus 301 first determines an imaging sequence (step S401) and transmits the determined imaging sequence to the RF coil apparatus 401 through the wireless communication unit 308 (step S402).

Subsequently, having received the imaging sequence, the control unit 405 of the RF coil apparatus 401 controls the constant voltage supply unit 408 based on the timing chart illustrated in FIG. 7 (step S403). Specifically, the control unit 405 stops the DCDC 409 and drives the LDO 410 at a time point earlier than the start of the acquisition duration by the first offset.

Subsequently, in the acquisition duration, the sensing unit 402 of the RF coil apparatus 401 acquires the NMR signal 307 and the A/D converter 403 acquires measurement data by converting the NMR signal 307 into a digital signal (step S404). In this case, since the LDO 410 is operational, no harmonic noise is generated and no noise mixture in the measurement data due to the constant voltage supply unit 408 occurs.

Subsequently, the communication unit 404 of the RF coil apparatus 401 transmits, to the MRI apparatus 301 by wireless communication through the antenna 406, the measurement data output from the A/D converter 403 (step S405). In this case as well, since the LDO 410 is operational, no harmonic noise is generated and no noise mixture in the measurement data due to the constant voltage supply unit 408 occurs.

Subsequently, the control unit 405 of the RF coil apparatus 401 stops the LDO 410 and drives the DCDC 409 at a time point when the second offset has elapsed since the end of the transmission duration (step S406).

Thereafter, the control unit 405 of the RF coil apparatus 401 determines whether acquisition of the NMR signal 307 is scheduled based on the imaging sequence, and when the acquisition is scheduled (Yes at step S407), the control unit 405 repeats the above-described processing at steps S403 to S406 a defined number of times. When the acquisition is not scheduled (No at step S407), the control unit 405 ends the above-described series of processing.

In this manner, the MRI system according to the second embodiment drives the LDO 410 and stops the DCDC 409 based on the imaging sequence in the duration in which the measurement data is acquired and the duration in which the measurement data is transmitted. Accordingly, it is possible to prevent mixture of harmonic noise due to the DCDC 409 in the duration in which the NMR signal 307 obtained by the sensing unit 402 is acquired by the A/D converter 403 while preventing degradation of electric power efficiency, thereby obtaining a highly accurate measurement result.

Similarly to the first embodiment, in any above-described processing, the control unit 405 may stop the LDO 410 and drive the DCDC 409 irrespective of the imaging sequence when the RF coil apparatus 401 is disposed at a position outside the bore 302 of the MRI apparatus 301 in a case of measurement interruption, emergency, or the like. As described for the configuration of the MRI system, since the faint NMR signal 307 of the subject 304 cannot be measured unless the RF coil apparatus 401 is disposed in the bore 302, power saving may be prioritized.

However, from a viewpoint of noise mixture, it is desirable to drive the LDO 410 and stop the DCDC 409 in the duration in which the measurement data is transmitted. Specifically, when the RF coil apparatus 401 is disposed at a position outside the bore 302 of the MRI apparatus 301, the control unit 405 drives the LDO 410 and stops the DCDC 409 in the transmission duration and drives the DCDC 409 and stops the LDO 410 in the duration other than the transmission duration.

Third Embodiment

Subsequently, the following describes a third embodiment. Although the first and second embodiments are described above with an MRI system including an MRI apparatus and an RF coil apparatus, the present embodiment is described with an example in which an MRI apparatus includes the RF coil apparatus described above in each embodiment.

Figure 9:
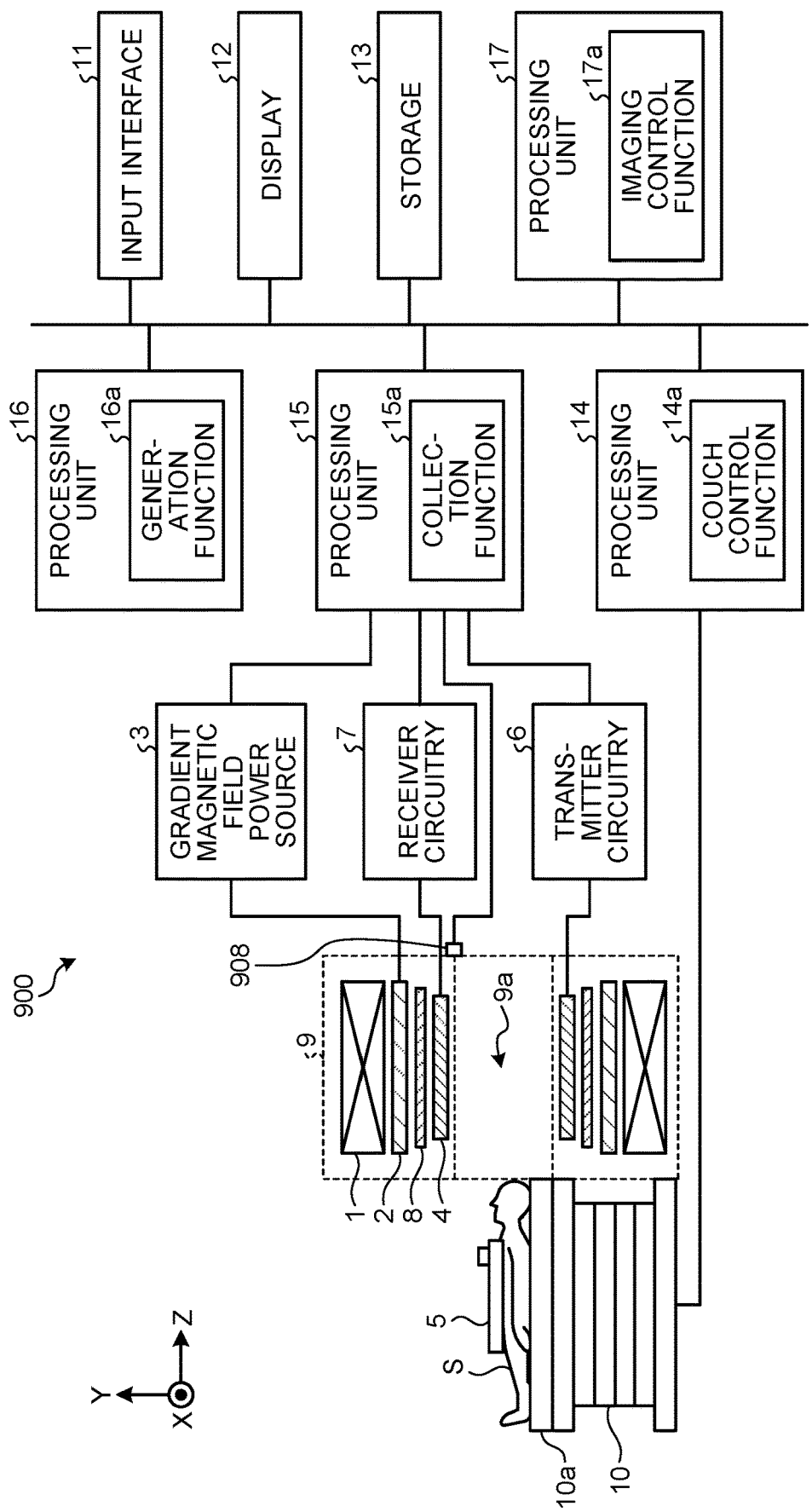
FIG. 9 is a diagram illustrating an exemplary configuration of an MRI apparatus according to a third embodiment.

FIG. 9 is a diagram illustrating an exemplary configuration of an MRI apparatus according to the third embodiment.

For example, as illustrated in FIG. 9, an MRI apparatus 900 includes a static magnetic field magnet 1, a gradient coil 2, a gradient magnetic field power source 3, a whole body RF coil 4, a local RF coil 5, a transmitter circuitry 6, a receiver circuitry 7, an RF shield 8, a gantry 9, a couch 10, an input interface 11, a display 12, a storage 13, and processing units 14 to 17.

The static magnetic field magnet 1 generates a static magnetic field in a space in a bore 9*a* included in the gantry 9. Specifically, the static magnetic field magnet 1 is formed in a hollow substantially cylindrical shape (having an elliptical sectional shape orthogonal to the central axis) and generates a static magnetic field in the space in the bore 9*a* disposed on the inner periphery side thereof. For example, the static magnetic field magnet 1 is a superconductive magnet or a permanent magnet. The superconductive magnet is constituted by, for example, a container filled with coolant such as liquid helium, and a superconductive coil immersed in the container.

The gradient coil 2 is disposed inside the static magnetic field magnet 1 and generates a gradient magnetic field in the bore 9*a* included in the gantry 9. Specifically, the gradient coil 2 is formed in a hollow substantially cylindrical shape (having an elliptical sectional shape orthogonal to the central axis) and includes an X coil, a Y coil, and a Z coil corresponding to an X axis, a Y axis, and a Z axis, respectively, orthogonal to one another. The X coil, the Y coil, and the Z coil each generate, based on current supplied from the gradient magnetic field power source 3, a gradient magnetic field that linearly changes in the corresponding axial direction. The Z axis is set along a magnetic flux of a static magnetic field generated by the static magnetic field magnet 1. The X axis is set along a horizontal direction orthogonal to the Z axis, and the Y axis is set along a vertical direction orthogonal to the Z axis. The X axis, the Y axis, and the Z axis constitute an apparatus coordinate system unique to the MRI apparatus 900.

The gradient magnetic field power source 3 supplies current to the gradient coil 2, thereby generating the above-described gradient magnetic fields. Specifically, the gradient magnetic field power source 3 individually supplies current to each of the X coil, the Y coil, and the Z coil of the gradient coil 2, thereby generating a gradient magnetic field that linearly changes in a readout direction, a phase encode direction, or a slice direction, respectively, orthogonal to one another. An axis aligned with the readout direction, an axis aligned with the phase encode direction, and an axis aligned with the slice direction constitute a logical coordinate system for defining a slice region or a volume region as an imaging target.

Specifically, the gradient magnetic field in each of the readout direction, the phase encode direction, and the slice direction is superimposed on the static magnetic field generated by the static magnetic field magnet 1, thereby providing spatial position information to an NMR signal generated from a subject S. Specifically, the gradient magnetic field in the readout direction provides position information in the readout direction to the NMR signal by changing the frequency of the NMR signal in accordance with the position in the readout direction. The gradient magnetic field in the phase encode direction provides position information in the phase encode direction to the NMR signal by changing the phase of the NMR signal in accordance with the position in the phase encode direction. The gradient magnetic field in the slice direction provides position information in the slice direction to the NMR signal. For example, the gradient magnetic field in the slice direction is used to determine the direction and thickness of a slice section and the number of slice sections when imaging (2D imaging) of the slice section is performed, and the gradient magnetic field in the slice direction is used to change the phase of the NMR signal in accordance with the position in the slice direction when imaging (3D imaging) of volume data is performed.

The whole body RF coil 4 is disposed on the inner periphery side of the gradient coil 2, applies an RF pulse (such as an excitation pulse) to the subject S disposed in the bore 9*a* of the gantry 9, and receives an NMR signal (such as an echo signal) generated from the subject S due to influence of the RF pulse. Specifically, the whole body RF coil 4 is formed in a hollow substantially cylindrical shape (having an elliptical sectional shape orthogonal to the central axis) and applies an RF pulse to the subject S disposed in the bore 9*a* of the gantry 9 based on an RF pulse signal supplied from the transmitter circuitry 6. Then, the whole body RF coil 4 receives an NMR signal generated from the subject S due to influence of the RF pulse and outputs the received NMR signal to the receiver circuitry 7. For example, the whole body RF coil 4 is a birdcage coil or a transverse electromagnetic (TEM) coil.

The local RF coil 5 is disposed in the bore 9*a* of the gantry 9 together with the subject S at imaging and receives an NMR signal generated from the subject S. Specifically, the local RF coil 5 is prepared for each site of the subject S and disposed near each imaging target site when imaging of the subject S is performed, and receives an NMR signal generated from the subject S due to influence of an RF pulse applied by the whole body RF coil 4. Then, the local RF coil 5 generates NMR data by converting the received NMR signal from an analog signal into a digital signal and outputs the generated NMR data to the processing unit 15. For example, the local RF coil 5 is a surface coil or a phased array coil formed by combining a plurality of surface coils as coil elements.

The transmitter circuitry 6 outputs, to the whole body RF coil 4, an RF pulse signal corresponding to a resonance frequency (Larmor frequency) unique to a target atomic nucleus placed in the static magnetic field. Specifically, the transmitter circuitry 6 includes a pulse generator, an RF generator, a modulator, and an amplifier. The pulse generator generates the waveform of an RF pulse signal. The RF generator generates an RF signal with the resonance frequency. The modulator generates an RF pulse signal by modulating the amplitude of the RF signal generated by the RF generator with the waveform generated by the pulse generator. The amplifier amplifies the RF pulse signal generated by the modulator and outputs the amplified RF pulse signal to the whole body RF coil 4.

The receiver circuitry 7 generates NMR data based on the NMR signal output from the whole body RF coil 4 and outputs the generated NMR data to the processing unit 15. Specifically, the receiver circuitry 7 includes a selector, a pre-amplifier, a phase wave detector, and an A/D converter. The selector selectively inputs the NMR signal output from the whole body RF coil 4. The pre-amplifier amplifies the NMR signal output from the selector. The phase wave detector detects the phase of the NMR signal output from the pre-amplifier. The A/D converter generates NMR data by converting the analog signal output from the phase wave detector into a digital signal and outputs the generated NMR data to the processing unit 15. Not all processing performed by the receiver circuitry 7 in the above description necessarily need to be performed by the receiver circuitry 7, but part (for example, processing by the A/D converter) of the processing may be performed by the whole body RF coil 4.

The RF shield 8 is disposed between the gradient coil 2 and the whole body RF coil 4 and shields the gradient coil 2 from the RF pulse generated by the whole body RF coil 4. Specifically, the RF shield 8 is formed in a hollow substantially cylindrical shape (having an elliptical sectional shape orthogonal to the central axis of the cylindrical shape) and disposed in a space on the inner periphery side of the gradient coil 2 to cover the outer peripheral surface of the whole body RF coil 4.

The gantry 9 includes the hollow bore 9a formed in a substantially cylindrical shape (having an elliptical sectional shape orthogonal to the central axis) and houses the static magnetic field magnet 1, the gradient coil 2, the whole body RF coil 4, and the RF shield 8. Specifically, the gantry 9 houses the static magnetic field magnet 1, the gradient coil 2, the whole body RF coil 4, and the RF shield 8 in a state in which the whole body RF coil 4 is disposed on the outer periphery side of the bore 9a, the RF shield 8 is disposed on the outer periphery side of the whole body RF coil 4, the gradient coil 2 is disposed on the outer periphery side of the RF shield 8, and the static magnetic field magnet 1 is disposed on the outer periphery side of the gradient coil 2. The space in the bore 9a included in the gantry 9 is an imaging region in which the subject S is disposed at imaging.

The couch 10 includes a couchtop (bed) 10a on which the subject S is placed, and moves the couchtop 10a on which the subject S is placed into the bore 9a of the gantry 9 when imaging of the subject S is to be performed. For example, the couch 10 is installed such that the longitudinal direction of the couchtop 10a is parallel to the central axis of the static magnetic field magnet 1.

In this example, the MRI apparatus 900 has what is called a tunnel structure in which the static magnetic field magnet 1, the gradient coil 2, and the whole body RF coil 4 are each formed in a substantially cylindrical shape, but the embodiment is not limited thereto. For example, the MRI apparatus 900 may have what is called an open structure in which a pair of static magnetic field magnets, a pair of gradient coils, and a pair of RF coils are disposed such that the elements of each pair face each other across the imaging region in which the subject S is disposed. In such an open structure, a space sandwiched between the pair of static magnetic field magnets, the pair of gradient coils, and the pair of RF coils corresponds to the bore in the tunnel structure.

The input interface 11 receives an operation of inputting various instructions and various kinds of information from an operator. Specifically, the input interface 11 is connected to the processing unit 17, converts the input operation received from the operator into an electric signal, and outputs the converted input operation to the processing unit 17. For example, the input interface 11 is configured as a truck ball, a switch button, a mouse, a keyboard, a touch pad on which an input operation is performed upon touch on an operation surface, a touch screen as an integration of a display screen and a touch pad, a non-contact input circuitry using an optical sensor, or a voice input circuitry, which are used to perform, for example, setting of an imaging condition and a region of interest (ROI). In the present specification, the input interface 11 is not limited to a configuration including a physical operation member such as a mouse or a keyboard. Examples of the input interface 11 include an electric signal processing unit configured to receive, from an external input instrument provided separately from the apparatus, an electric signal corresponding to an input operation and output the electric signal to a control circuitry.

The display 12 displays various kinds of information. Specifically, the display 12 is connected to the processing unit 17, converts data of various kinds of information transferred from the processing unit 17 into a display electric signal, and outputs the display electric signal. For example, the display 12 is configured as a liquid crystal monitor, a CRT monitor, or a touch panel.

The storage 13 stores various kinds of data. Specifically, the storage 13 is connected to the processing units 14 to 17 and stores various kinds of data input and output by each processing unit. For example, the storage 13 is configured as a semiconductor memory element such as a random access memory (RAM) or a flash memory, a hard disk, or an optical disk.

The processing unit 14 has a couch control function 14a. The couch control function 14a controls operation of the couch 10 by outputting a control electric signal to the couch 10. For example, the couch control function 14a receives an instruction for moving the couchtop 10a in the longitudinal direction, the up-down direction, or the right-left direction from the operator through the input interface 11 and operates a movement mechanism of the couchtop 10a included in the couch 10 so that the couchtop 10a moves in accordance with the received instruction.

The processing unit 15 has a collection function 15a. The collection function 15a collects k-space data of the subject S based on an imaging sequence output from the imaging control function 17a (described later) of the processing unit 17. Specifically, the collection function 15a collects NMR data by driving the gradient magnetic field power source 3, the transmitter circuitry 6, the receiver circuitry 7, and the local RF coil 5 in accordance with various image capturing sequences output from the image capturing control function 17a of the processing unit 17. Each imaging sequence is information that defines the timing at which the gradient magnetic field power source 3 supplies current to the gradient coil 2, the strength of the supplied current, the timing at which the transmitter circuitry 6 supplies an RF pulse signal to the whole body RF coil 4, the strength of the supplied RF pulse signal, the timing at which the receiver circuitry 7 samples the NMR signal, and the like. Then, the collection function 15a causes the storage 13 to store the NMR data output from the receiver circuitry 7 and the local RF coil 5. In this case, the NMR data is stored in the storage 13 as k-space data representing a two-dimensional or three-dimensional k space when provided with the position information along each of the readout direction, the phase encode direction, and the slice direction by the above-described gradient magnetic fields.

The processing unit 16 has a generation function 16a. The generation function 16a generates an image from the k-space data of the subject S collected by the collection function 15a of the processing unit 15. Specifically, the generation function 16a reads, from the storage 13, the k-space data collected by the collection function 15a of the processing unit 15 and performs reconstruction processing such as Fourier transform on the read k-space data, thereby generating a two-dimensional or three-dimensional image. Then, the generation function 16a causes the storage 13 to store the generated image.

The processing unit 17 has an imaging control function 17a. The imaging control function 17a receives inputting of an imaging condition from the operator through the input interface 11 and generates, based on the input imaging condition, an imaging sequence for collecting the k-space data of the subject S. The imaging control function 17a outputs the imaging sequence generated to the processing unit 15 to cause the collection function 15a of the processing unit 15 to collect the k-space data. In addition, the imaging control function 17a controls the processing unit 16 to cause the processing unit 16 to reconstruct an image from the k-space data collected by the collection function 15a of the processing unit 15. Moreover, in accordance with a request from the operator, the imaging control function 17a reads an image stored in the storage 13 and causes the display 12 to display the read image.

For example, each of the processing units 14 to 17 is configured as a processor. In this case, the processing function of each processing unit is stored, for example, in the form of a computer-executable computer program in the storage 13. Each processing unit reads the computer program from the storage 13 and executes the computer program, thereby implementing the processing function corresponding to the computer program. In other words, each processing unit having read the computer program has the corresponding function illustrated in processing unit in FIG. 9.

Each of the processing units 14 to 17 does not necessarily need to be configured as a single processor. For example, each processing unit may be configured as a combination of a plurality of independent processors and implement the corresponding processing function as each processor executes a computer program. The processing function of each processing unit may be implemented by being distributed or integrated to one or a plurality of pieces of processing unit as appropriate. Although the single storage 13 stores the computer program corresponding to each processing function in the above description, the embodiment is not limited thereto. For example, a plurality of storages may be distributed for the respective pieces of processing unit, and the pieces of processing unit may read the corresponding computer programs from the individual storages.

With such a configuration, in the present embodiment, the local RF coil 5 has the configuration of the RF coil apparatus 401 described in the first or second embodiment. Specifically, the local RF coil 5 includes the sensing unit 402, the A/D converter 403, the communication unit 404, the control unit 405, the antenna 406, the battery 407, and the constant voltage supply unit 408, which are illustrated in FIG. 4.

In the present embodiment, the MRI apparatus 900 includes a wireless communication unit 908 connected to the collection function 15a of the processing unit 15. Similarly to the first or second embodiment, NMR data (measurement data), an imaging sequence, a clock signal, and the like are transmitted and received between the local RF coil 5 and the collection function 15a of the processing unit 15. In the present embodiment, the input interface 11, the display 12, the storage 13, and the processing units 14 to 17 correspond to the image processing apparatus described in the first and second embodiments.

Accordingly, with the MRI apparatus 900 according to the third embodiment as well, similarly to the first and second embodiments, it is possible to prevent mixture of harmonic noise due to the DCDC 409 in the duration in which the NMR signal 307 obtained by the sensing unit 402 is acquired by the A/D converter 403 while preventing degradation of electric power efficiency, thereby obtaining a highly accurate measurement result.

Other Embodiments

The embodiments above are described with an example in which wireless communication between an RF coil apparatus and an MRI apparatus is performed, but the embodiments are not limited thereto. For example, the method for controlling the RF coil apparatus described in the above-described embodiments is also applicable to a case in which communication between an RF coil apparatus and an MRI apparatus is performed in a wired manner through a transmission line or the like as in the example illustrated in FIGS. 1 and 2.

The embodiments above are described with an example in which the constant voltage supply unit 408 includes the DCDC 409 and the LDO 410, but the embodiments are not limited thereto. For example, a switching regulator and a linear regulator of any other kind may be used as long as the switching regulator has higher voltage conversion efficiency than the linear regulator and the linear regulator has smaller harmonic noise than the switching regulator. For example, another switching regulator configured to control output voltage by switching on and off of a switch element may be used in place of the DCDC 409. Examples of such a switching regulator include a converter of a pulse width modulation (PWM) control scheme and a converter of a pulse frequency modulation (PFM) control scheme. For example, another linear regulator configured to linearly operate the relation between input voltage and output voltage by controlling a control element inserted between an input and an output may be used in place of the LDO 410.

The above description is made with an example in which a "processor" reads and executes each computer program corresponding to a processing function from a storage, but the embodiments are not limited thereto. The term "processor" means a circuit such as a central processing unit (CPU), a graphics processing unit (GPU), an ASIC, or a programmable logic device (for example, a SPLD, a CPLD, or a FPGA). When the processor is, for example, a CPU, the processor implements each processing function by reading and executing a computer program stored in the storage. When the processor is an ASIC, the processing function is directly incorporated as a logic circuit in a circuit of the processor in place of the computer program being stored in the storage. Each processor of the present embodiment is not limited to a configuration in which each processor is configured as a single circuit, but may be configured as one processor by combining a plurality of independent circuits to implement any processing function. Moreover, a plurality of constituent components in FIG. 1 may be integrated in one processor to implement the processing function.

Any computer program executed by the processor is incorporated in a read only memory (ROM), a storage, or the like in advance and provided. The computer program may be recorded and provided in a computer-readable storage medium such as a compact disc (CD)-ROM, a flexible disk (FD), a compact disc recordable (CD-R), or a digital versatile disc (DVD) as a file in a format installable or executable on these devices. The computer program may be stored in a computer connected to a network such as the Internet and provided or distributed by downloading through the network. For example, the computer program is configured as modules including above-described functional components. In an actual hardware configuration, each module is loaded onto a main storage device and generated on the main storage device as a CPU reads and executes the computer program from a storage medium such as a ROM.

According to at least one embodiment described above, a highly accurate measurement result can be obtained without degradation of electric power efficiency of an RF coil apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radio frequency coil apparatus to be disposed in a bore of a magnetic resonance imaging apparatus, the radio frequency coil apparatus comprising:
    processing circuitry configured to
        acquire a nuclear magnetic resonance signal generated from a subject placed in the bore,
        supply voltage to a constituent component of the radio frequency coil apparatus by using a switching regulator and a linear regulator, and
        selectively drive the switching regulator and the linear regulator based on an imaging sequence of the magnetic resonance imaging apparatus, wherein
    the processing circuitry is further configured to drive the linear regulator in a first duration including a duration in which the nuclear magnetic resonance signal is acquired, and drive the switching regulator in a second duration other than the first duration.

2. The radio frequency coil apparatus according to claim 1, wherein
    the imaging sequence defines execution of scanning including transmission of a radio frequency magnetic field and acquisition of the nuclear magnetic resonance signal that are performed by the magnetic resonance imaging apparatus.

3. The radio frequency coil apparatus according to claim 2, wherein
    the processing circuitry is further configured to set the first duration based on a transmission timing of the radio frequency magnetic field or an acquisition duration of the nuclear magnetic resonance signal that are defined by the imaging sequence.

4. The radio frequency coil apparatus according to claim 1, wherein
    the processing circuitry is further configured to receive the imaging sequence from the magnetic resonance imaging apparatus by wireless communication.

5. The radio frequency coil apparatus according to claim 1, wherein
    the processing circuitry is further configured to transmit measurement data based on the nuclear magnetic resonance signal to the magnetic resonance imaging apparatus by wireless communication.

6. The radio frequency coil apparatus according to claim 4, wherein
    the wireless communication is performed by using a frequency higher than the frequency of the nuclear magnetic resonance signal.

7. The radio frequency coil apparatus according to claim 5, wherein
    the wireless communication is performed by using a frequency higher than the frequency of the nuclear magnetic resonance signal.

8. The radio frequency coil apparatus according to claim 5, wherein
    the processing circuitry is further configured to drive the linear regulator in a third duration including a duration in which the measurement data is transmitted in addition to the first duration, and drive the switching regulator in a fourth duration other than the first duration and the third duration.

9. The radio frequency coil apparatus according to claim 1, wherein
    the processing circuitry is further configured to drive the switching regulator when the radio frequency coil apparatus is disposed at a position outside the bore of the magnetic resonance imaging apparatus.

10. The radio frequency coil apparatus according to claim 8, wherein
    the processing circuitry is further configured to, when the radio frequency coil apparatus is disposed at a position outside the bore of the magnetic resonance imaging apparatus, drive the linear regulator in the third duration and drive the switching regulator in a duration other than the third duration.

11. The radio frequency coil apparatus according to claim 1, further comprising a battery, wherein
    the processing circuitry is further configured to supply voltage from the battery to the constituent component.

12. A method for controlling a radio frequency coil apparatus including processing circuitry and to be disposed in a bore of a magnetic resonance imaging apparatus, the method comprising:

acquiring, by the processing circuitry, a nuclear magnetic resonance signal generated from a subject placed in the bore;

supplying, by the processing circuitry, voltage to a constituent component of the radio frequency coil apparatus by using a switching regulator and a linear regulator; and selectively driving, by the processing circuitry, the switching regulator and the linear regulator based on an imaging sequence of the magnetic resonance imaging apparatus, wherein the processing circuitry drives the linear regulator in a first duration including a duration in which the nuclear magnetic resonance signal is acquired, and drives the switching regulator in a second duration other than the first duration.

* * * * *